US011842903B2

(12) United States Patent
Park et al.

(10) Patent No.: US 11,842,903 B2
(45) Date of Patent: Dec. 12, 2023

(54) APPARATUS FOR TREATING SUBSTRATE AND METHOD FOR TREATING SUBSTRATE

(71) Applicant: Semes Co., Ltd, Cheonan-si (KR)

(72) Inventors: Miso Park, Daejeon (KR); Yong Hee Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 457 days.

(21) Appl. No.: 17/061,622

(22) Filed: Oct. 2, 2020

(65) Prior Publication Data
US 2021/0104418 A1 Apr. 8, 2021

(30) Foreign Application Priority Data

Oct. 2, 2019 (KR) .................. 10-2019-0121990

(51) Int. Cl.
*H01L 21/67* (2006.01)
*B08B 7/00* (2006.01)

(52) U.S. Cl.
CPC ...... *H01L 21/67051* (2013.01); *B08B 7/0021* (2013.01)

(58) Field of Classification Search
CPC ......... H01L 21/67051; H01L 21/67017; H01L 21/67103; H01L 21/6719; H01L 21/67098; H01L 21/6715; H01L 21/67742; B08B 7/0021
See application file for complete search history.

(56) References Cited

U.S. PATENT DOCUMENTS 6,635,116 B1 * 10/2003 Mayeda .............. C23C 16/4408
118/715
2016/0334162 A1 * 11/2016 Kim .................. H01L 21/67109

FOREIGN PATENT DOCUMENTS

| JP | 2013-074243 A | 4/2013 |
| JP | 2013-251550 A | 12/2013 |
| JP | 2018-060895 A | 4/2018 |
| JP | 2018-093063 A | 6/2018 |
| KR | 20130134996 A * | 12/2013 |
| KR | 101480198 B1 | 1/2015 |
| KR | 101536724 B1 | 7/2015 |

(Continued)

OTHER PUBLICATIONS

NPL-1 Bagatur, El-Cezeri Journal of Science and Engineering, vol. 5, No. 3, 2018 (724-733) https://pdfs.semanticscholar.org/7ddf/09d76e36494c1f7cde14dedead8234d8ea28.pdf?_ga=2.11659828.1461508712.1671238511- (Year: 2018).*

(Continued)

*Primary Examiner* — Michael E Barr
*Assistant Examiner* — Pallavi Chitta
(74) *Attorney, Agent, or Firm* — Harness, Dickey & Pierce, P.L.C.

(57) ABSTRACT

An apparatus for treating a substrate is provided. The apparatus for treating the substrate includes a high pressure chamber to provide a treatment space to perform a process of treating the substrate using a process fluid, a fluid supply source to provide the process fluid to the high pressure chamber, a fluid supply unit to supply the process fluid to the treatment space of the high pressure chamber, an exhaust unit to exhaust the process fluid in the high pressure chamber, and a pre-vent unit to vent a process fluid remaining inside a supply line.

13 Claims, 11 Drawing Sheets

(56) References Cited

FOREIGN PATENT DOCUMENTS

| | | | |
|---|---|---|---|
| KR | 20160135035 A | 11/2016 | |
| KR | 10-2017-0133694 A | 12/2017 | |
| KR | 101824809 B1 | 2/2018 | |
| KR | 101856606 B1 | 5/2018 | |
| KR | 2020-0001481 A | 1/2020 | |
| WO | WO-2017033979 A1 * | 3/2017 | ........... C23C 16/401 |

OTHER PUBLICATIONS

Office Action dated Jan. 16, 2021, issued in corresponding Korean Patent Application No. 10-2019-0121990.
Korean Notice of Allowance dated May 21, 2021 issued in corresponding Korean Appln. No. 10-2019-0121990.
Japanese Office Action dated Nov. 1, 2022 issued in corresponding Japanese Appln. No. 2020-166794.

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2019-0121990 filed on Oct. 2, 2019, in the Korean Intellectual Property Office, the entire contents of which are hereby incorporated by reference.

BACKGROUND

Embodiments of the inventive concept described herein relate to an apparatus for treating a substrate and a method for treating a substrate.

A semiconductor process refers to a process of cleaning a thin film, foreign matters, or particles on a substrate. As a design rule of a semiconductor device is reduced, pattern collapse or a bridge failure, in which adjacent patterns add to each other, may be often caused by surficial tension of a chemical liquid in the process of drying the chemical liquid after completing a wet process, such as an etch process or a cleaning process In addition, fine particles deeply present between patterns may cause the failure of a semiconductor.

Recently, a supercritical fluid has been used in the process of cleaning the substrate. According to an embodiment, there are provided a liquid treating chamber to perform liquid treatment for the substrate by supplying a treatment liquid to the substrate, and a high pressure chamber to remove the treatment liquid from the substrate using the supercritical fluid after the liquid treatment. Accordingly, a substrate completely subject to the treatment in the liquid treating chamber is introduced into the high pressure chamber by a transfer robot.

SUMMARY

The present inventors have found defects by comparing a first substrate and a second substrate, which are introduced, with each other in a supercritical process using a supercritical fluid and have suggested the inventive concept to overcome the defects.

Embodiments of the inventive concept provide an apparatus for treating a substrate, capable of improving treatment efficiency when treating a substrate using a supercritical fluid, and a method for treating a substrate.

Embodiments of the inventive concept provide an apparatus for treating a substrate, capable of reducing particles supplied to a substrate when treating the substrate using a supercritical fluid, and a method for treating a substrate.

The objects which will be achieved in the inventive concept are not limited to the above, but other objects, which are not mentioned, will be apparently understood to those skilled in the art.

According to an exemplary embodiment, an apparatus for treating a substrate include a high pressure chamber to provide a treatment space to perform a process of treating the substrate by using a process fluid, a fluid supply source to provide the process fluid to the high pressure chamber, a fluid supply unit to supply the process fluid to the treatment space of the high pressure chamber, an exhaust unit to exhaust the process fluid in the high pressure chamber, and a pre-vent unit to vent a process fluid remaining inside a supply line. The fluid supply unit includes a supply line to connect the high pressure chamber to the fluid supply source, a supply valve installed in the supply line, and a heater provided in the supply line. The exhaust unit includes an exhaust line connected to the high pressure chamber, and an exhaust valve installed in the exhaust line. The pre-vent unit includes a first pre-vent line having one end connected to the supply line of the fluid supply unit and an opposite end which is vented, and a first pre-vent valve installed in the first pre-vent line.

According to an embodiment, the pre-vent unit further may include a second pre-vent line having one end connected to the exhaust line and an opposite end connected to the first pre-vent line, and a second pre-vent valve installed in the second pre-vent line.

According to an embodiment, the second pre-vent line may have a diameter provided to be less than a diameter of a part, which is connected to the second pre-vent line, of the first pre-vent line.

According to an embodiment, the second pre-vent line may be connected to the exhaust line upstream of the exhaust valve.

According to an embodiment, the second pre-vent line may be connected to the first pre-vent line downstream of the first pre-vent valve.

According to an embodiment, a diameter of a part, which is connected to the second pre-vent line, of the first pre-vent line may be provided to be less than a diameter of the first pre-vent line upstream of the part connected to the second pre-vent line.

According to an embodiment, the apparatus may further include a controller. The controller may open the supply valve, the first pre-vent valve, and the second pre-vent valve, after the substrate is introduced into the high pressure chamber and the high pressure chamber is closed.

According to an embodiment, the first pre-vent line may be connected to the supply line upstream of the supply valve.

According to an embodiment, the supply line may include an upper supply line connected to an upper portion of the high pressure chamber, and a lower supply line connected to a lower portion of the high pressure chamber. The first pre-vent line may be connected to the lower supply line.

According to an embodiment, the supply valve may include a first supply valve interposed between the fluid supply source, and a branch point between the upper supply line and the lower supply line, a second supply valve installed in the upper supply line, and a third supply valve installed in the lower supply line. The first pre-vent line may be connected to the lower supply line upstream of the second supply valve.

According to an embodiment, the first pre-vent line may be connected to the supply line downstream of the line heater.

According to an embodiment, the free-vent unit may include a second pre-vent line having one end connected to the exhaust line and an opposite end connected to the first pre-vent line, and a second pre-vent valve installed in the second pre-vent line. The second pre-vent valve may be further open after the substrate is introduced into the high pressure chamber and the high pressure chamber is closed.

In addition, according to an exemplary embodiment, an apparatus for treating a substrate includes a liquid treating chamber to supply a treatment liquid to the substrate and perform liquid treatment for the substrate, a supercritical chamber to treat the substrate by using a process fluid in a supercritical state, a transfer robot to carry the substrate between the liquid treating chamber and the supercritical chamber, and a controller. The liquid treating chamber includes a support unit to support the substrate, a nozzle to supply the treatment liquid on the substrate, and a cup to surround the support unit and provide a treatment space. The supercritical chamber includes a high pressure chamber to provide the treatment space to perform a process of treating the substrate using a process fluid, a fluid supply source to provide the process fluid to the high pressure chamber, a supply line to connect the high pressure chamber to the fluid supply source, a supply valve installed in the supply line, a heater provided in the supply line, an exhaust unit to exhaust the process fluid in the high pressure chamber, and a pre-vent unit to vent a process fluid remaining inside the supply line. The pre-vent unit includes a first pre-vent line having one end connected to the supply line and an opposite end which is vented, and a first pre-vent valve installed in the first pre-vent line.

According to an embodiment, the controller may start pre-venting the supply line of the supercritical chamber by opening the first pre-vent valve while the substrate is treated in the liquid treating chamber.

According to an embodiment, the controller may open the supply valve of the supercritical chamber and the first pre-vent valve, before introducing the substrate, which is subject to the liquid treatment in the liquid treating chamber, into the high pressure chamber.

According to an embodiment, the pre-vent unit further may include a second pre-vent line having one end connected to the exhaust line and an opposite end connected to the first pre-vent line, and a second pre-vent valve installed in the second pre-vent line. The controller may further open the second pre-vent valve after the substrate is introduced into the high pressure chamber and the high pressure chamber is closed.

According to an embodiment, the second pre-vent line may have a diameter provided to be less than a diameter of the first pre-vent line.

According to an embodiment, a diameter of a part, which is connected to the second pre-vent line, of the first pre-vent line may be provided to be less than a diameter of the first pre-vent line upstream of the part connected to the second pre-vent line.

According to an embodiment, the treatment liquid may be an anti-leaning liquid.

In addition, according to an exemplary embodiment, a method for treating a substrate using the apparatus for treating the substrate. According to an embodiment, the supply valve and the first pre-vent valve are open, before the substrate is introduced into the high pressure chamber.

According to an embodiment, the pre-vent unit may include a second pre-vent line having one end connected to the exhaust line and an opposite end connected to the first pre-vent line, and a second pre-vent valve installed in the second pre-vent line. The second pre-vent valve may be further open after the substrate is introduced into the high pressure chamber and the high pressure chamber is closed.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
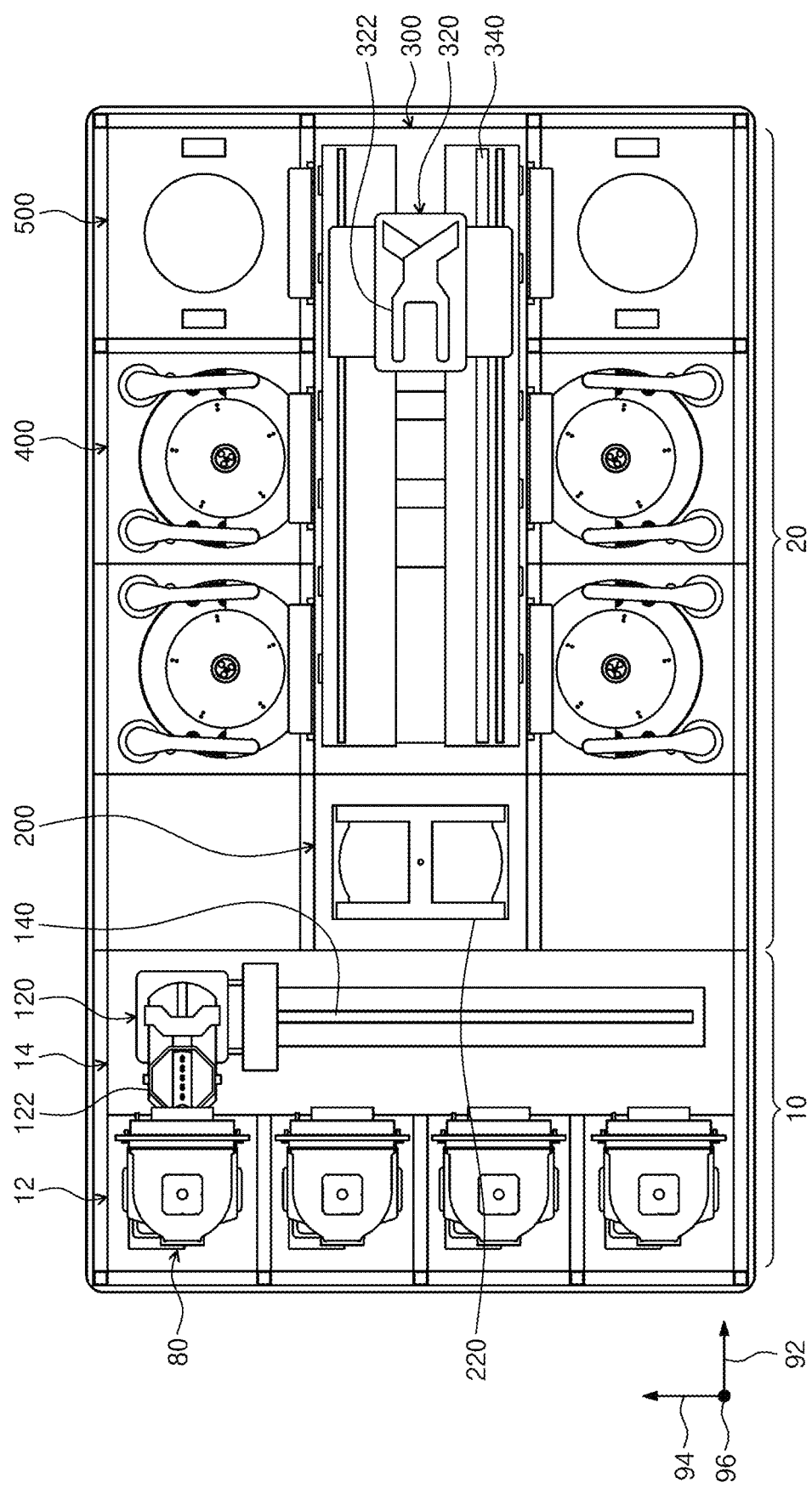
FIG. 1 is a view schematically illustrating an apparatus for treating a substrate, according to an embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

FIG. 1 is a view schematically illustrating an apparatus (substrate treatment apparatus) for treating a substrate, according to an embodiment of the inventive concept.

Referring to FIG. 1, the substrate treatment apparatus includes an index module 10, a treating module 20, and a controller (not illustrated). According to an embodiment, the index module 10 and the treating module 20 are disposed in one direction. Hereinafter, a direction in which the index module 10 and the treating module 20 are arranged will be referred to as a first direction 92, a direction that is perpendicular to the first direction 92 when viewed from above will be referred to as a second direction 94, and a direction perpendicular to all the first direction 92 and the second direction 94 will be referred to as a third direction 96.

The index module 10 carries a substrate 'W' to the treating module 20 from a container 80 having the substrate 'W' received therein, and a substrate 'W' completely treated in the treating module 20 is received into the container 80. The longitudinal direction of the index module 10 is provided in the second direction 94. The index module 10 has a loadport 12 and an index frame 14. The loadport 12 is positioned at an opposite side of the treating module 20, based on the index frame 14. The container 80 having substrates 'W' is placed in the loadport 12. A plurality of loadports 12 may be provided and may be arranged in the second direction 94.

The container 80 may include a container for sealing such as a front open unified pod (FOUP). The container 80 may be placed on the loadport 12 by a transfer unit (not illustrated) such as Overhead Transfer, Overhead Conveyor, or Automatic Guided Vehicle, or a worker.

An index robot 120 is provided inside the index frame 14. A guide rail 140, which has a longitudinal direction provided in the second direction 94, may be provided in the index frame 14, and the index robot 120 may be provided to be movable on the guide rail 140. The index robot 120 may include a hand 122 in which the substrate 'W' is positioned, and the hand 122 may be provided to be movable forward and backward, rotatable about the third direction 96, and movable in the third direction 96. A plurality of hands 122 are spaced apart from each other in a vertical direction, and are individually movable forward and rearward.

The treating module 20 includes a buffer unit 200, a transfer chamber 300, a liquid treating chamber 400, and a high pressure chamber 500.

The buffer unit 200 provides a space in which a substrate 'W' introduced into the treating module 20 and a substrate 'W' withdrawn from the treating module 20 temporarily stay.

The liquid treating chamber 400 is to perform a liquid treatment process of performing liquid treatment for the substrate 'W' by supplying a liquid onto the substrate 'W'.

The high pressure chamber 500 is to perform a drying process of removing a liquid remaining on the substrate 'W'.

The transfer chamber 300 is to transport the substrate 'W' between any two of the buffer unit 200, the liquid treating chamber 500, and the high pressure chamber 500. The transfer chamber 300 may be disposed such that the longitudinal direction thereof becomes the first direction 92.

The buffer unit 200 may be interposed between the index module 10 and the transfer chamber 300. For example, the liquid treating chamber 400 and the high pressure chamber 500 may be disposed at a side portion of the transfer chamber 300. The liquid treating chamber 400 and the transfer chamber 300 may be disposed in the first direction 92. The high pressure chamber 500 and the transfer chamber 300 may be disposed in the second direction 94. The buffer unit 200 may be positioned at one end of the transfer chamber 300.

According to an embodiment, the liquid treating chambers 400 may be disposed at opposite sides of the transfer chamber 300, and the high pressure chambers 500 may be disposed at opposite sides of the transfer chamber 300. The liquid treating chambers 400 may be disposed at a position closer to the buffer unit 200 rather than the high pressure chamber 500. The liquid treating chambers 400 at one side of the transfer chamber 300 may be arranged in the form of a matrix of A×B ('A' and 'B' are '1s' or natural numbers greater than '1') in the first direction 92 and the third direction 96. In addition, the high pressure chambers 500 at one side of the transfer chamber 300 may be arranged in the form of a matrix of C×D ('C' and 'D' are '1s' or natural numbers greater than '1') in the first direction 92 and the third direction 96. As described above, only the liquid treating chambers 400 may be provided at one side of the transfer chamber 300, and only the high pressure chamber 500 may be provided at an opposite side of the transfer chamber 300.

A transfer robot 320 is provided in the transfer chamber 300. A guide rail 340, which has a longitudinal direction provided in the second direction 92, may be provided in the transfer chamber 300, and the transfer robot 320 may be provided to be movable on the guide rail 340. The transfer robot 320 may include a hand 322 to hold the substrate 'W', and the hand 322 may be provided to be movable forward and backward, rotatable about the third direction 96, and movable in the third direction 96. A plurality of hands 322 are spaced apart from each other in the vertical direction, and are mutually individually movable forward and rearward.

The buffer unit 200 includes a plurality of buffers 220 to place the substrate 'W'. The buffers 220 may be disposed to be spaced apart from each other in the third direction 96. The buffer unit 200 is open in a front face and a rear face. The front surface faces the index module 10, and the rear surface faces the transfer chamber 300. The index robot 120 may access the buffer unit 200 through the front face, and the transfer robot 320 may access the buffer unit 200 through the rear surface.

Figure 2:
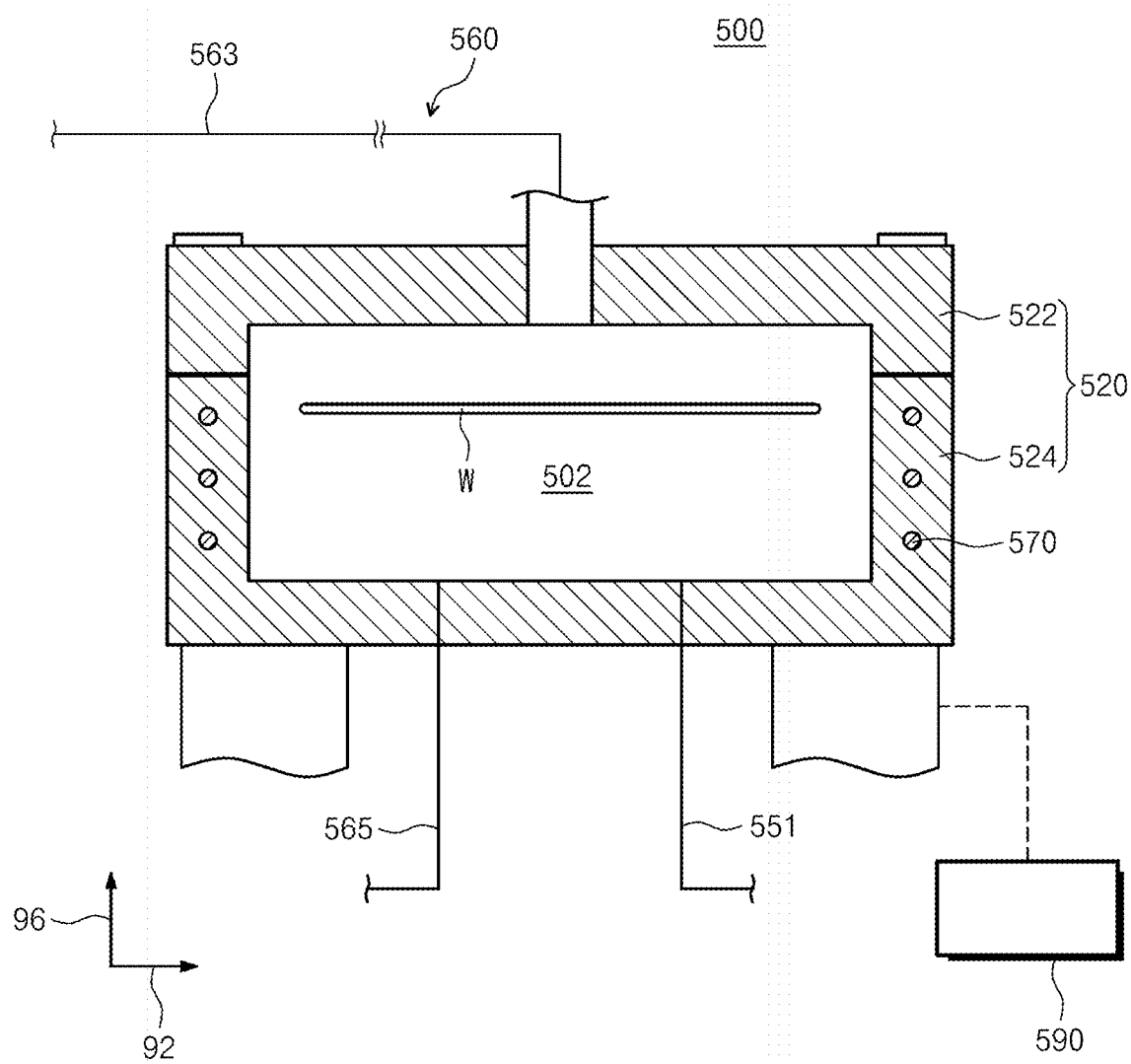
FIG. 2 is a view schematically illustrating a high pressure chamber of FIG. 1, according to an embodiment.

FIG. 2 is a view schematically illustrating an embodiment of the high pressure chamber 500 of FIG. 1. According to an embodiment, the high pressure chamber 500 is to remove the liquid from the substrate 'W' using the supercritical fluid. The high pressure chamber 500 has a body 520, a substrate support unit (not illustrated), a fluid supply unit 560, and a blocking plate (not illustrated).

The body 520 provides a treatment space 502 to perform the drying process. The body 520 has an upper body 522 and a lower body 524, and the upper body 522 and the lower body 524 are combined with each other to provide the above-described treatment space 502. The upper body 522 is provided at an upper portion of the lower body 524. The position of the upper body 522 is fixed and the lower body 524 may be moved up and down by a driving member 590 such as a cylinder. When the lower body 524 is spaced apart from the upper body 522, the treatment space 502 is open. In this case, the substrate 'W' is introduced or withdrawn. When the process is performed, the lower body 524 makes contact with the upper body 522 to seal the treatment space 502 from the outside. The high pressure chamber 500 has a heater 530. According to an embodiment, the heater 530 is positioned inside the wall of the body 520. The heater 530 heats the treatment space 502 of the body 520 such that the fluid supplied into the inner space of the body 520 is maintained in a supercritical state.

Meanwhile, although not illustrated in the drawings, a substrate support unit (not illustrated) may be provided inside the treatment space 502 to support the substrate 'W'. The substrate support unit (not illustrated) supports the substrate 'W' inside the treatment space 502 of the body 520. The substrate support unit (not illustrated) may be installed in the lower body 524 to support the substrate 'W'. In this case, the substrate support unit (not illustrated) may have the shape to lift and support the substrate 'W'. The substrate support unit (not illustrated) may be installed in the upper body 522 to support the substrate 'W'. In this case, the substrate support unit (not illustrated) may have the shape to suspend and support the substrate 'W'.

An exhaust unit 550 includes an exhaust line 551. The exhaust line 551 may be coupled to the lower body 524. The supercritical fluid in the treatment space 502 of the body 520 is exhausted to the outside of the body 520 through the exhaust line 551.

The fluid supply unit 560 supplies a process fluid to the treatment space 502 of the body 520. According to an embodiment, the process fluid may be supplied, in the supercritical state, to the treatment space 502. Unlike, the process fluid may be supplied, in a gas state, to the treatment space 502, and may be phase-shifted to the supercritical state in the treatment space. The process fluid may be a drying fluid.

According to an embodiment, the fluid supply line 560 has an upper supply line 563 and a lower supply line 565.

The upper supply line 563 and the lower supply line 565 supply the process fluid from above the substrate 'W' placed on the substrate support unit (not illustrated). According to an embodiment, the upper supply line 563 is coupled to the upper body 522. Further, the upper supply line 563 may be coupled to the central portion of the upper body 522.

The lower supply line 565 may be coupled to the lower body 524. A second supply valve 582 may be installed in the upper supply line 563. A third supply valve 583 may be installed in the lower supply line 565.

When the lower supply line 565 may be coupled to the lower body 524, a blocking plate (not illustrated) may be disposed in the treatment space 502 of the body 520. The blocking plate (not illustrated) may be provided in the shape of a disk. The blocking plate (not illustrated) is supported by a support member (not illustrated) such that the blocking plate is spaced apart upward from the bottom surface of the body 520. The support member (not illustrated) is provided in the shape of a rod, and a plurality of support members are provided to be spaced apart from each other by a uniform distance. A discharge port of the lower supply line 565 and an inlet port of the exhaust line 551 may be provided at positions that do not interfere with each other. The blocking plate (not illustrated) may prevent the substrate 'W' from being damaged by directly discharging the process fluid, which is supplied through a lower branch line (not illustrated), toward the substrate 'W'.

Figure 3:
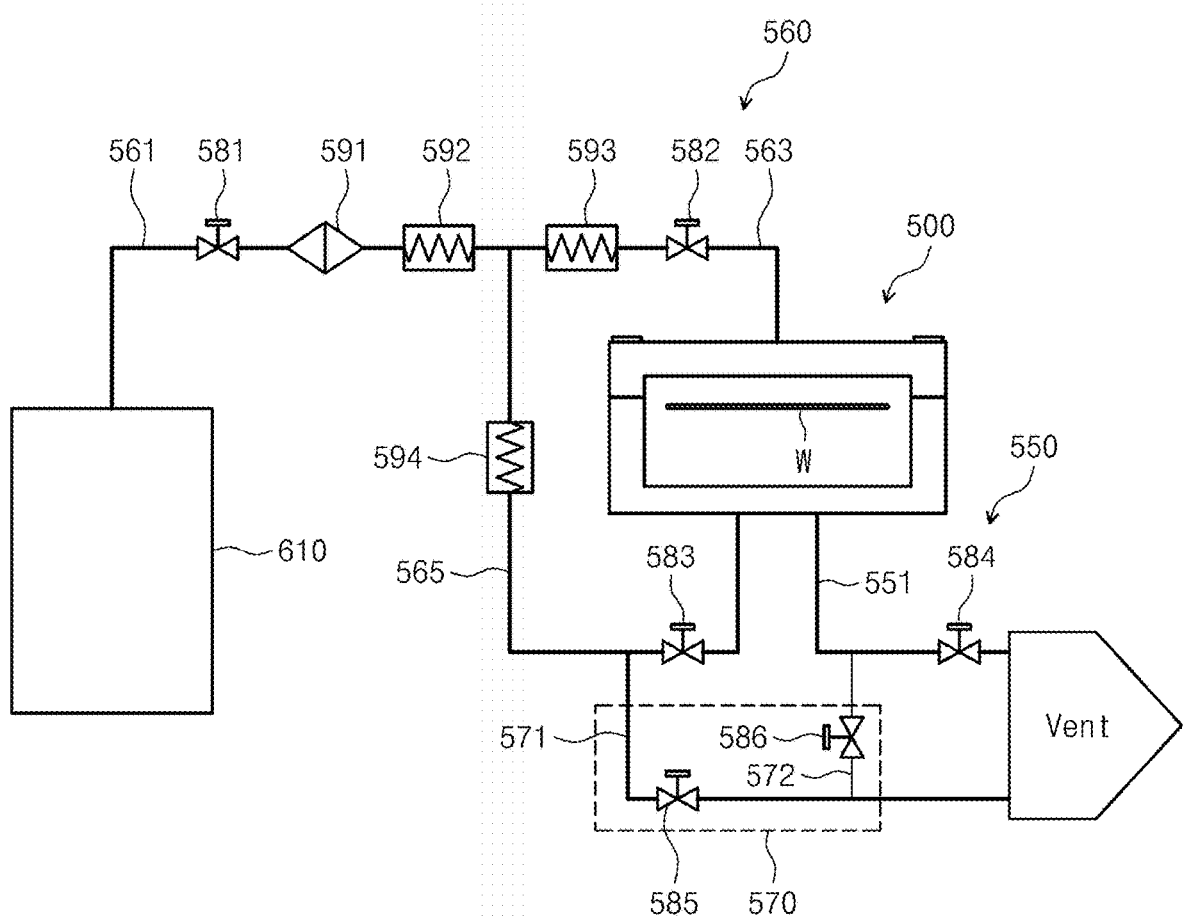
FIG. 3 is a schematic view illustrating an apparatus for treating a substrate, according to an embodiment of the inventive concept.

FIG. 3 is a schematic view illustrating a substrate treatment apparatus, according to an embodiment of the inventive concept. Hereinafter, the fluid supply unit 560 and a prepre-vent unit 570 will be described in detail with reference to FIG. 3.

The fluid supply unit 560 includes a fluid supply source 610 and a supply line 561.

The fluid supply source 610 stores a process fluid to be provided to the high pressure chamber 500. For example, the fluid supply source 610 is a storage tank or a reservoir tank. For example, the process fluid is carbon dioxide. The process fluid supplied from the fluid supply source 610 is supplied, in the supercritical phase, to the high pressure chamber 500.

The supply line 561 connects the high pressure chamber 500 to the fluid supply source 610. The supply line 561 supplies the process fluid stored in the fluid supply source 610 to the high pressure chamber 500. The supply line 561 is split into the upper supply line 563 and the lower supply line 565 at one point. The upper supply line 563 is connected to the upper body 522 of the high pressure chamber 500, and the lower supply line 565 is connected to the lower body 524 of the high pressure chamber 500. The supply line 561 has a first supply valve 581 before split. The second supply valve 582 may be installed in the upper supply line 563. The third supply valve 583 may be installed in the lower supply line 565.

A filter 591 and a first line heater 592 may be provided in a downstream direction from an upstream portion of the supply line 561, before a split point in the first supply valve 581 of the supply line 561.

A second line heater 593 may be provided in the upper supply line 563 at the upstream portion of the second supply valve 582. A third line heater 594 may be provided in the lower supply line 565 at the upstream portion of the third supply valve 583.

The lower supply line 565 is connected to the pre-vent unit 570 to vent the process fluid remaining in the supply line. The pre-vent unit 570 includes a first pre-vent line 571.

The first pre-vent line 571 branches from the lower supply line 565. A first pre-vent valve 585 is provided in the first pre-vent line 571. The downstream of the first pre-vent valve 585 is vented. The first pre-vent line 571 is connected to the lower supply line 565, between the third line heater 594 and the third supply valve 583 which are provided on the lower supply line 565.

The pre-vent unit 570 includes a second pre-vent line 572. One end of the second pre-vent line 572 is connected to the exhaust line 551, and an opposite end of the second pre-vent line 572 is connected to the first pre-vent line 571. A second pre-vent valve 586 is provided in the second pre-vent line 572, and an exhaust valve 584 is provided in the exhaust line 551. When the exhaust valve 584 is open, the process fluid inside the high pressure chamber 500 is discharged out of the high pressure chamber 500. The second pre-vent line 572 is connected to the exhaust line 551 upstream of the exhaust valve 584. In addition, the second pre-vent line 572 is connected to the first pre-vent line 571 downstream of the first pre-vent valve 585.

Figure 4:
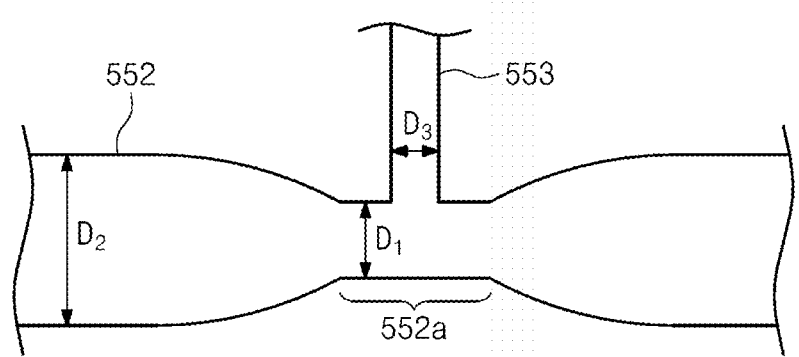
FIG. 4 illustrates a part to connect a first pre-vent line 571 to a second pre-vent line 572.

FIG. 4 illustrates a part to connect the first pre-vent line 571 to the second pre-vent line 572.

A diameter D1 of a part 552a, which is connected to the second pre-vent line 572, of the first pre-vent line 571 is provided to be less than a diameter D2 of the first pre-vent line 571 upstream of the part 552a connected to the second pre-vent line 572. In addition, a diameter D3 of the second pre-vent line 572 is provided to be less than the diameter D1 of the part 552a, which is connected to the second pre-vent line 572, of the first pre-vent line 571.

Figure 5:
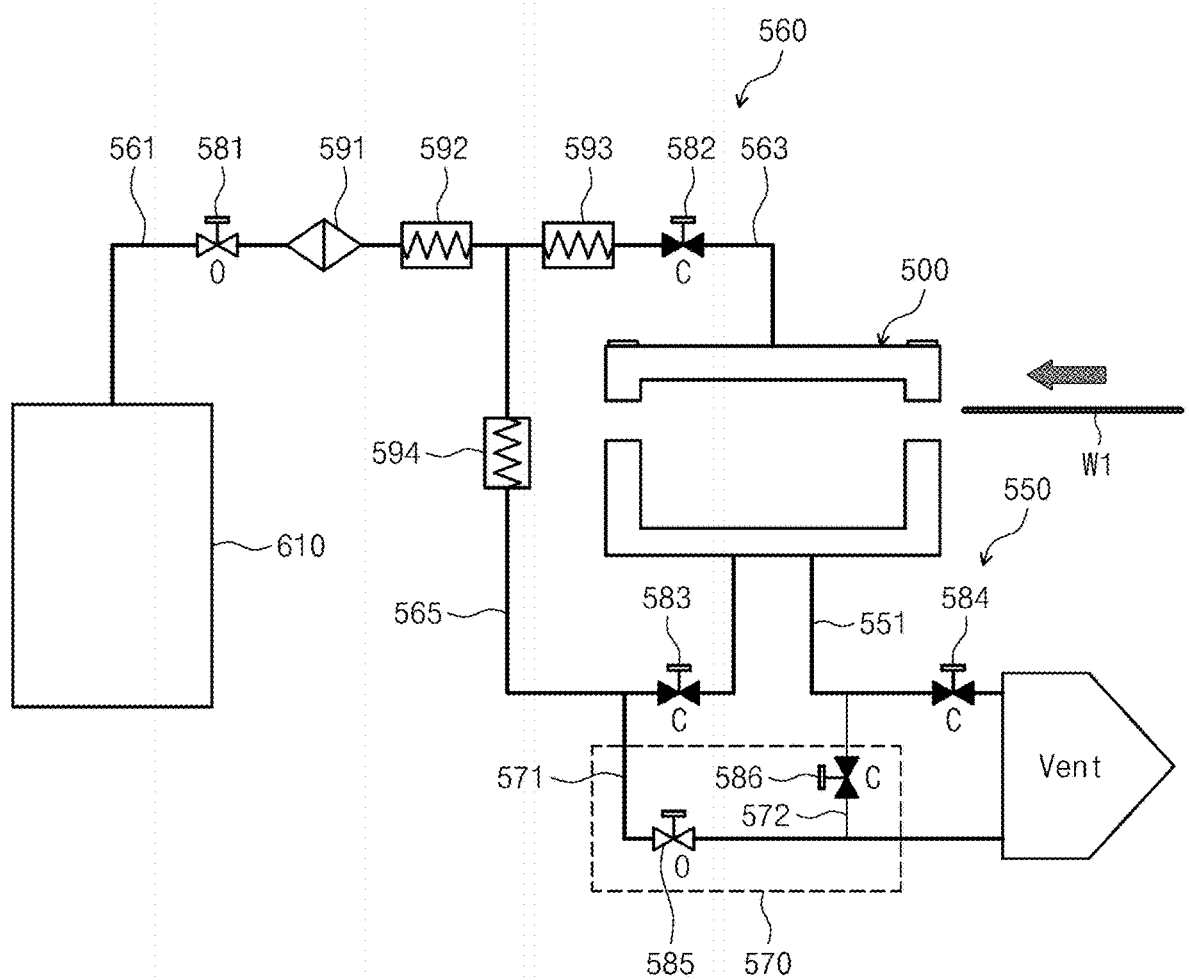
FIG. 5 is a view illustrating an operating state of an apparatus for treating a substrate before a substrate to be treated is introduced into a chamber, according to an embodiment of the inventive concept.

FIG. 5 is a view illustrating an operating state of a substrate treatment apparatus before a substrate to be treated is introduced into a chamber, according to an embodiment of the inventive concept. Referring to FIG. 5, before the substrate is introduced into the high pressure chamber 500, the first supply valve 581 and the first pre-vent valve 585 may be open, and the second supply valve 582, the third supply valve 583, the exhaust valve 584, and the second pre-vent valve 586 may be closed. The valves may be controlled by the controller (not illustrated).

Figure 6:
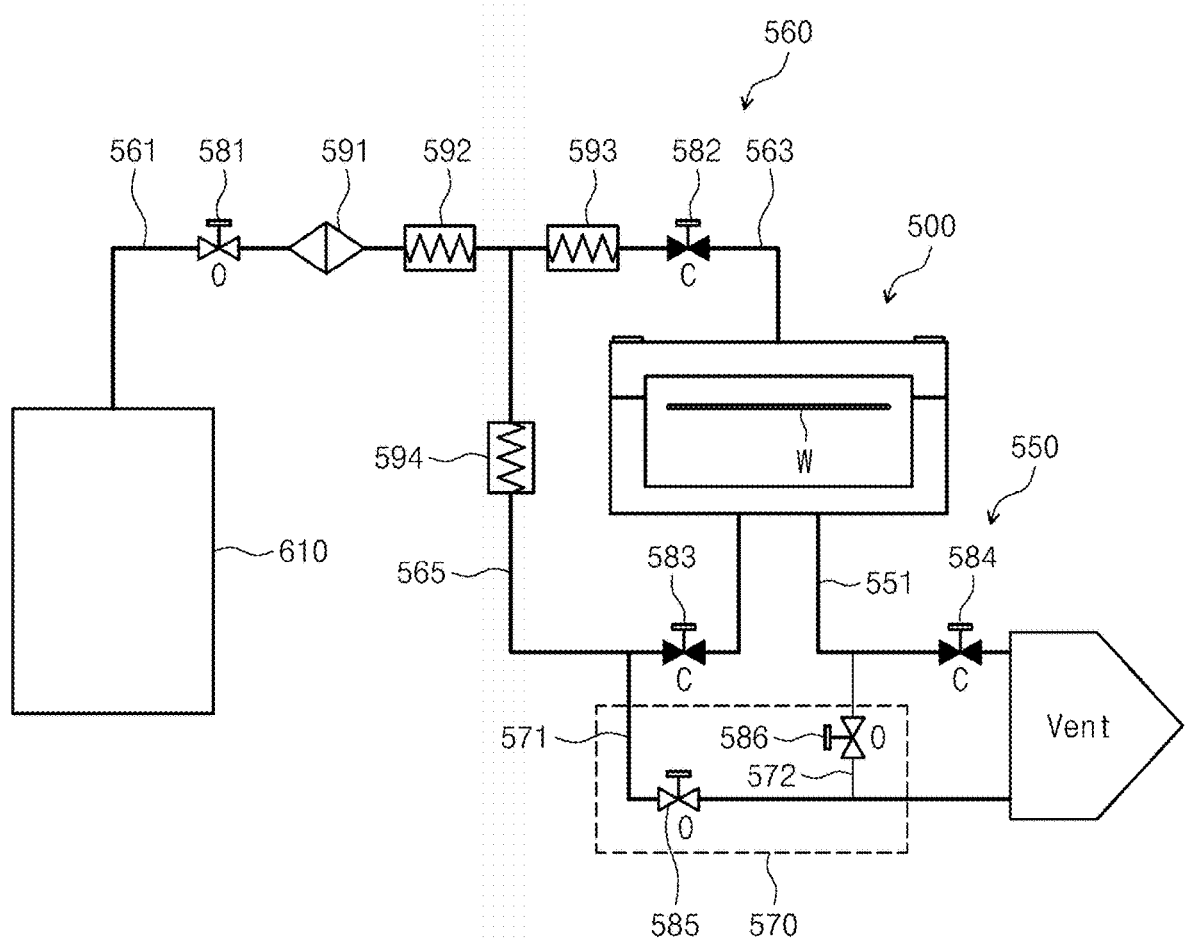
FIG. 6 illustrates an operating state of an apparatus for treating a substrate at a time point at which a high pressure chamber is closed after a substrate is introduced into the high pressure chamber, according to an embodiment of the inventive concept.

FIG. 6 illustrates an operating state of a substrate treatment apparatus at a time point at which a high pressure chamber is closed after the substrate is introduced into the high pressure chamber, according to an embodiment of the inventive concept. Referring to FIG. 6, the second pre-vent valve 586 is open subsequently to that the substrate is introduced into the high pressure chamber 500 and the high pressure chamber 500 is closed. In this case, the second supply valve 582, the third supply valve 583, and the exhaust valve 584 may be maintained closed. In this case, since the diameter D3 of the second pre-vent line 572 is less than that of the first pre-vent line 571, and the diameter D2 of the part, which is connected to the second pre-vent line 572, of the first pre-vent line 571, a Venturi effect may be produced. Accordingly, the treatment space 502 inside the high pressure chamber 500 is open to receive the substrate, thereby increasing the degree of vacuum inside the high pressure chamber 500 to remove particles such as the introduced water vapor.

Figure 7:
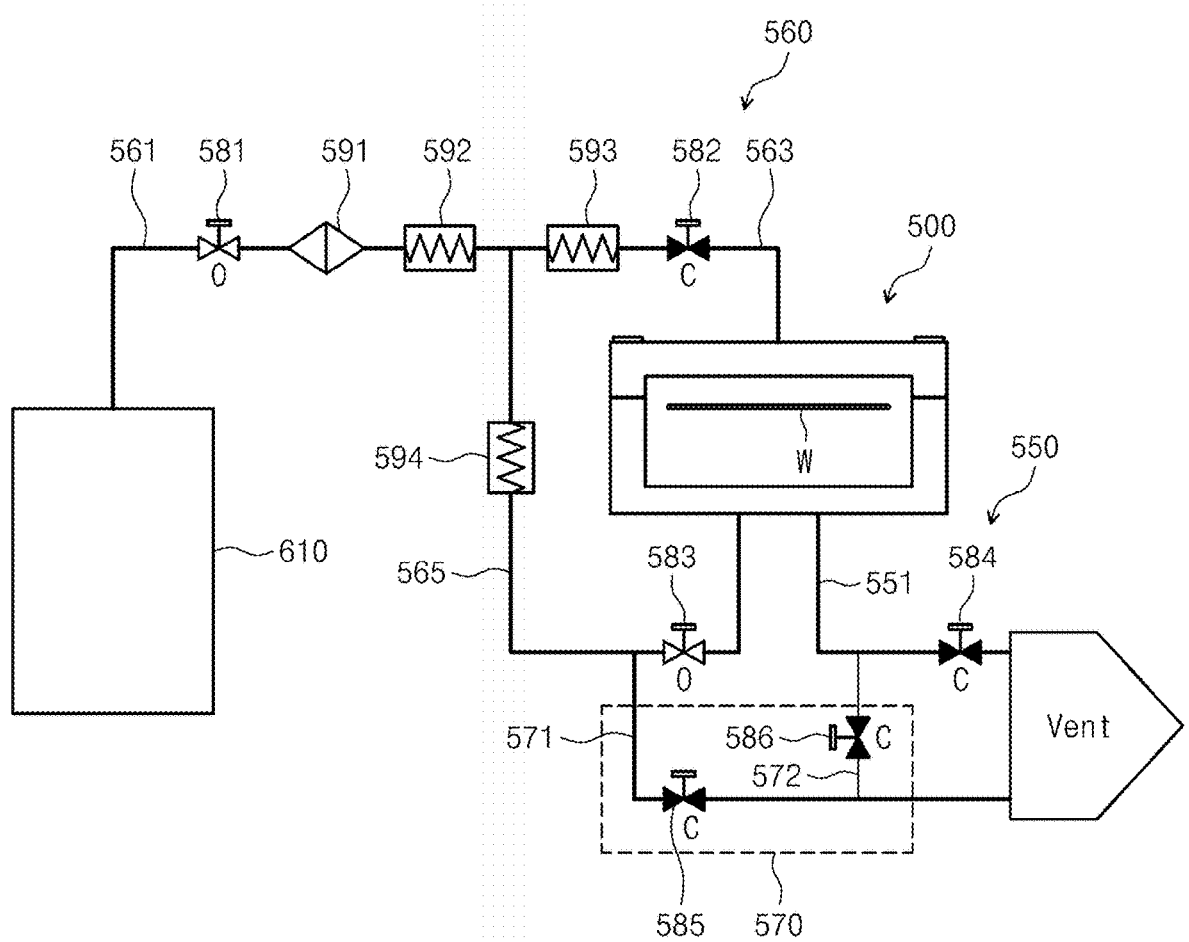
FIGS. 7 and 8 illustrate an operating state of an apparatus for treating a substrate, according to an embodiment of the inventive concept.
Figure 8:
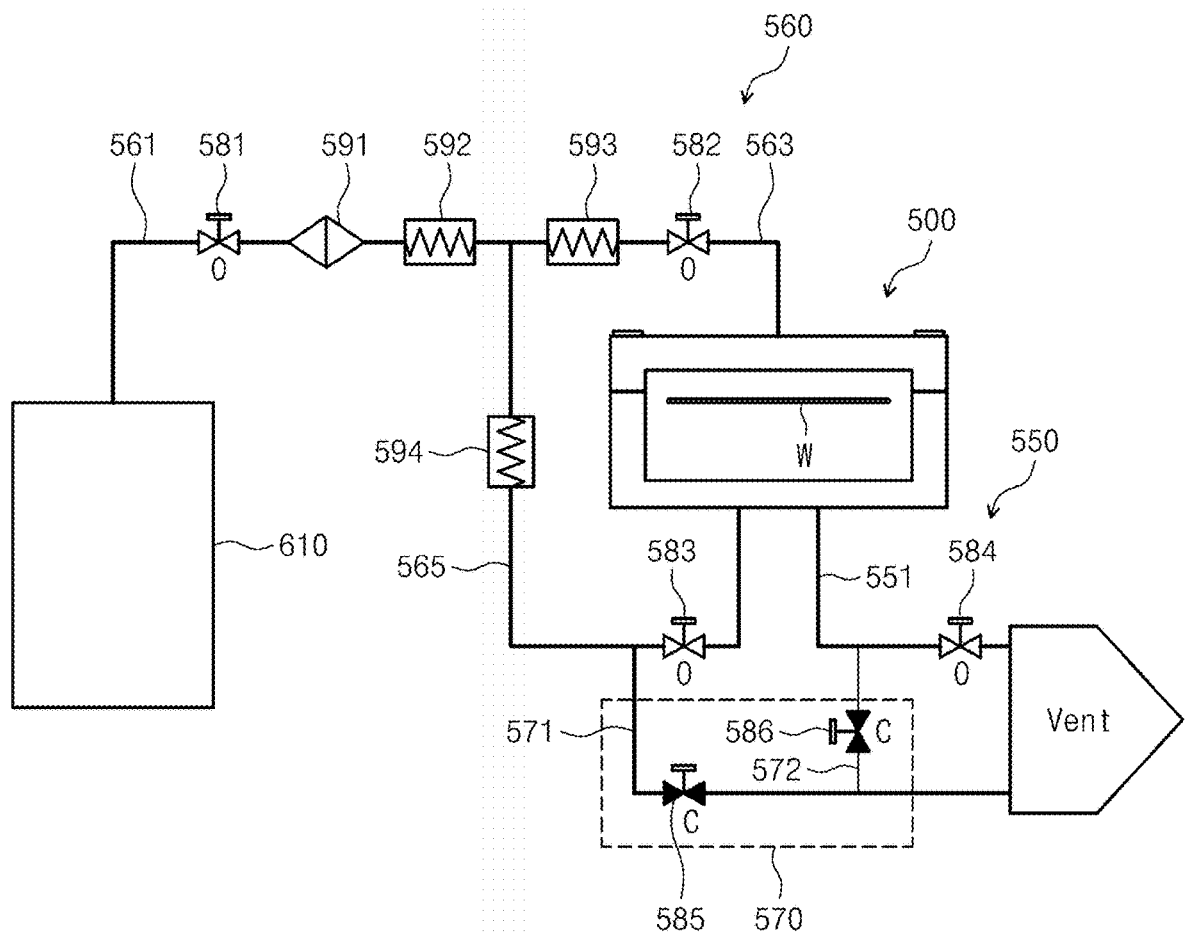

FIGS. 7 and 8 illustrate an operating state of a substrate treatment apparatus to treat a substrate, according to an embodiment of the inventive concept.

Referring to FIG. 7, a process fluid is supplied to the high pressure chamber 500 to process a substrate 'W1' loaded into the high pressure chamber 500. The process fluid may be supplied at the initial stage by opening only the third supply valve 583 of the lower supply line 565 and the first supply valve 581 of the supply line 561. The second supply valve 582, the first pre-vent valve 585, the second pre-vent valve 586, and the exhaust valve 584 may be closed. Accordingly, the internal pressure of the high pressure chamber 500 is increased to setting pressure.

When the internal pressure of the high pressure chamber 500 reaches the setting pressure, the second supply valve 582 is open and the exhaust valve 584 is open or closed if necessary as in illustrated FIG. 8. The treatment for the substrate may be performed by repeatedly supplying and exhausting the process fluid within a specific pressure range.

Figure 9:
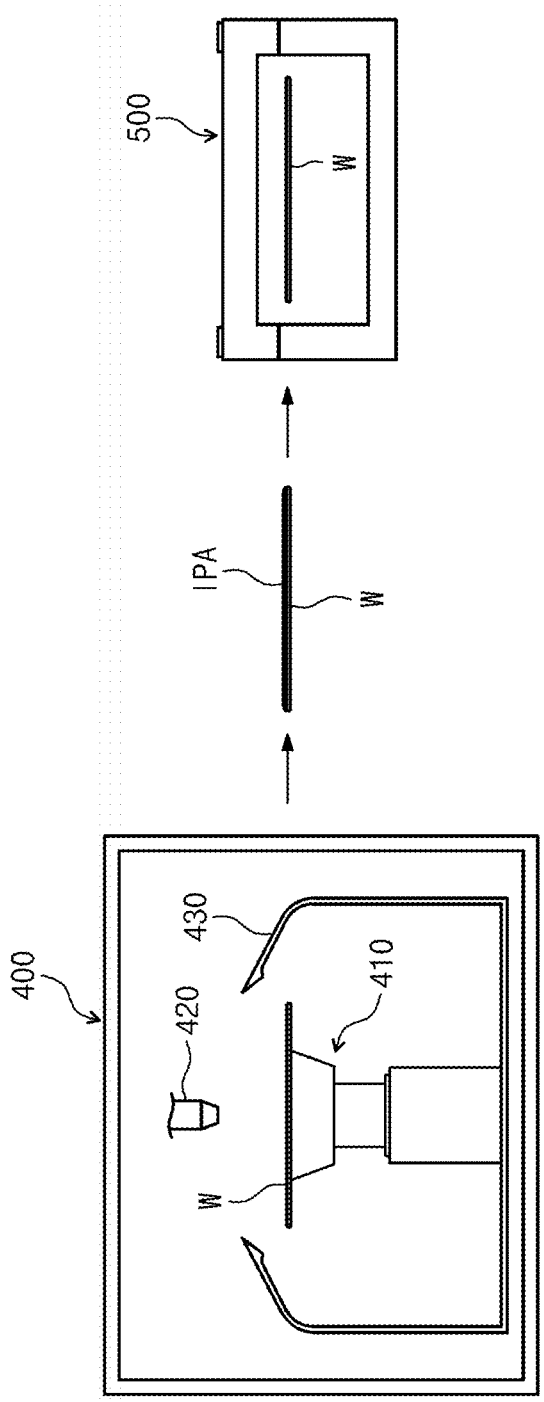
FIG. 9 illustrates a method of processing a substrate according to an embodiment of the inventive concept.

FIG. 9 illustrates a method of processing a substrate according to an embodiment of the inventive concept.

The liquid treating chamber 400 includes a support unit 410, a nozzle 420, and a cup 430. The support unit 410 supports a substrate 'W'. The support unit 410 supports the substrate 'W' and rotates the substrate 'W' during the process. The cup 430 surrounds the support unit 410 and provides a treatment space. The nozzle 420 supplies the treatment liquid to the substrate. The nozzle 420 may be connected to a nozzle support, a support shaft, and a driving motor. The nozzle 420 may be moved between the process position and the standby position. The process position is a position where the nozzle 420 is disposed vertically above the cup 430, and the standby position is defined as a position where the nozzle 420 deviates from the vertical upper portion of the cup 430. One or more nozzles may be provided. When a plurality of nozzles are provided, chemicals, a rinsing liquid, and an organic solvent may be provided through mutually different nozzles. The chemicals may be a liquid having the properties of a strong acid or a strong base. The rinsing liquid may be pure water. The organic solvent may be a mixture of vapor of isopropyl alcohol (IPA) and an inert gas or an isopropyl alcohol (IPA) liquid. Isopropyl alcohol (IPA) may be an anti-leaning liquid that prevents leaning of the substrate pattern in the process of in which the substrate is carried between chambers.

According to an embodiment, the treatment liquid supplied to the substrate 'W' is isopropyl alcohol (IPA). In the liquid treating chamber 400, isopropyl alcohol (IPA) is supplied to a pattern surface of the substrate 'W'. The substrate 'W' is carried to the high pressure chamber 500, with isopropyl alcohol (IPA) remaining on the pattern surface of the substrate 'W'. The carrying is performed by the transfer robot 320.

Figure 10:
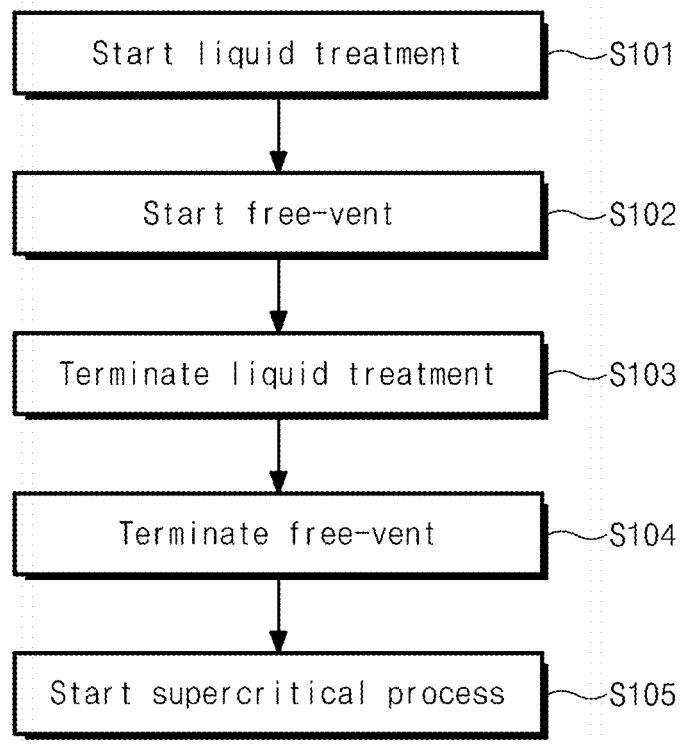
FIG. 10 is a view illustrating processing steps, according to an embodiment of the inventive concept.

FIG. 10 is a view illustrating processing steps, according to an embodiment of the inventive concept. Hereinafter, the processing steps will be described with reference to FIG. 10, according to an embodiment of the inventive concept. The liquid treatment for the substrate is started in the liquid treating chamber 400 (S101). After a specific time is elapsed from a time point at which the liquid treatment is started, the pre-vent is started by the pre-vent unit 570 of the high pressure chamber 500 (S102). In step S102, the pre-vent includes opening the first pre-vent valve 585 of the first pre-vent line 571 and opening the second pre-vent valve 586 of the second pre-vent line 572.

As soon as the liquid treatment is terminated (S103) or after a specific time is elapsed from a time point at which the liquid treatment is terminated, the pre-vent is terminated (S104). Thereafter, the supercritical process is started (S105). According to an embodiment, in step S104, the pre-vent includes closing the first pre-vent valve 585 of the first pre-vent line 571 and closing the second pre-vent valve 586 of the second pre-vent line 572.

According to an embodiment, in step S102, the pre-vent includes only opening the first pre-vent valve 585 of the first pre-vent line 571. When the high pressure chamber 500 is closed after the liquid treatment is terminated (S103) and the substrate is introduced in to the high pressure chamber 500, the second pre-vent valve 586 of the second pre-vent line 572 is further open. When vacuum is formed inside the treatment space 502 by the second pre-vent line 572 as the second pre-vent valve 586 is open for a specific time, the second pre-vent valve 586 is closed, the supercritical process is started (S105).

Figure 11:
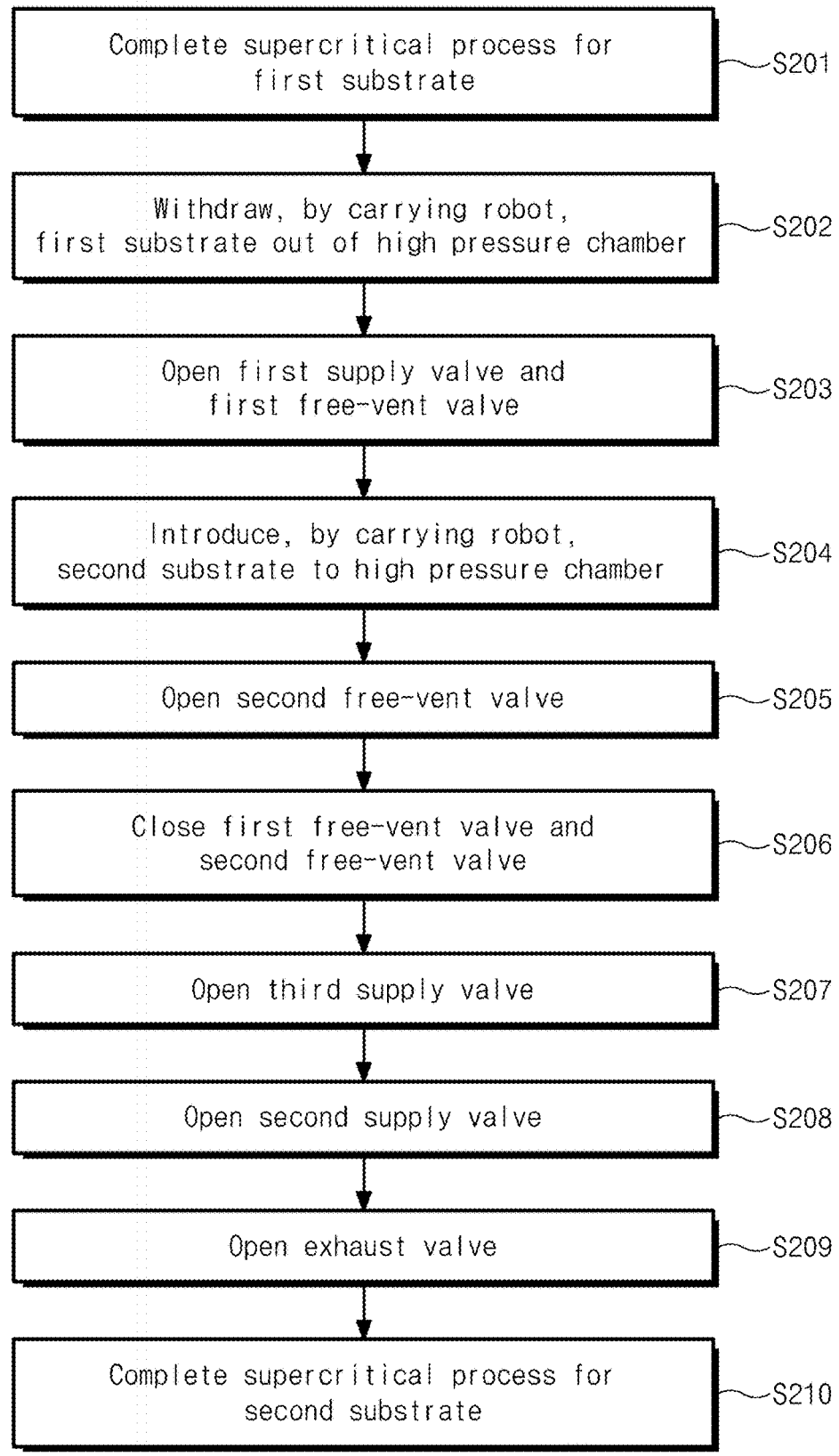
FIG. 11 is a view illustrating processing steps, according to another embodiment of the inventive concept.

FIG. 11 is a view illustrating processing steps, according to another embodiment of the inventive concept. Hereinafter, the processing steps will be described with reference to FIG. 11, according to another embodiment of the inventive concept. When the supercritical process is completed with respect to a first substrate (S201), the transfer robot 320 withdraws the first substrate from the high pressure chamber 500 (S202). In addition, the first supply valve 581 and the first pre-vent valve 585 are open (S203). Accordingly, a process fluid staying in the supply line 561 may be vent by a specific amount. Accordingly, the difference between the temperatures of process fluids for a substrate, which is first introduced, and a substrate, which is second introduced, may be improved. As the first pre-vent line 571 is open, the temperature of the injected process fluid may be uniformly maintained.

After the transfer robot 320 introduces a second substrate into the high pressure chamber 500, the high pressure chamber 500 is closed (S204). Then, the second pre-vent valve 586 is open (S205). Accordingly, the degree of vacuum inside the high pressure chamber 500 may be increased. When the inside of the high pressure chamber 500 reaches a specific degree of vacuum, the first pre-vent valve 585 and the second pre-vent valve 586 are closed (S206). Thereafter, the third supply valve 583 is open to make the inner part of the processing space 502 to be at a supercritical atmosphere (S207), and the second supply valve 582 is open to perform a supercritical process (S208). The exhaust valve 584 is open or closed if necessary (S209). The treatment for the substrate may be performed by repeatedly supplying and exhausting the process fluid within a specific pressure range. When the supercritical process for the second substrate is completed (S210), the above-described process is repeated such that the treatment for the third substrate may be performed.

According to an embodiment of the inventive concept, the defects may be reduced in the first substrate introduced in the supercritical process using the supercritical fluid.

In addition, according to an embodiment of the inventive concept, when treating the substrate using the supercritical fluid, the treatment efficiency may be improved.

In addition, according to an embodiment of the inventive concept, when treating the substrate using the supercritical fluid, the particles supplied to the substrate may be reduced.

The effects produced in the inventive concept are not limited to the aforementioned effects, and any other effects not mentioned herein will be clearly understood from the detailed description and accompanying drawings by those skilled in the art to which the inventive concept pertains.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a high pressure chamber configured to provide a treatment space to perform a process of treating the substrate by using a process fluid;
   a fluid supply source configured to provide the process fluid to the high pressure chamber;
   a fluid supply unit configured to supply the process fluid to the treatment space of the high pressure chamber;
   an exhaust unit configured to exhaust the process fluid in the high pressure chamber; and
   a pre-vent unit configured to vent a process fluid remaining inside a supply line,
   wherein the fluid supply unit includes:
   a supply line configured to connect the high pressure chamber to the fluid supply source;
   a supply valve installed in the supply line; and
   a line heater provided in the supply line,
   wherein the exhaust unit includes:
   an exhaust line having one end connected to the high pressure chamber and an opposite end which is vented; and
   an exhaust valve installed in the exhaust line, and
   wherein the pre-vent unit includes:
   a first pre-vent line having one end connected to the supply line of the fluid supply unit and an opposite end which is vented;
   a first pre-vent valve installed in the first pre-vent line;
   a second pre-vent line having one end connected to the exhaust line and an opposite end vented through being connected to the end of the first pre-vent line which is vented; and
   a second pre-vent valve installed in the second pre-vent line,
   wherein the second pre-vent line has a diameter provided to be less than a diameter of a part, which is connected to the second pre-vent line, of the first pre-vent line.

2. The apparatus of claim 1, wherein the second pre-vent line is connected to the exhaust line upstream of the exhaust valve.

3. The apparatus of claim 1, wherein the second pre-vent line is connected to the first pre-vent line downstream of the first pre-vent valve.

4. The apparatus of claim 1, further comprising:
   a controller,
   wherein the controller is configured to:
   open the supply valve, the first pre-vent valve, and the second pre-vent valve, after the substrate is introduced into the high pressure chamber and the high pressure chamber is closed.

5. The apparatus of claim 1, wherein the first pre-vent line is connected to the supply line upstream of the supply valve.

6. The apparatus of claim 1, wherein the supply line includes:
   an upper supply line connected to an upper portion of the high pressure chamber; and
   a lower supply line connected to a lower portion of the high pressure chamber, and
   wherein the first pre-vent line is connected to the lower supply line.

7. The apparatus of claim 6, wherein the supply valve includes:
   a first supply valve interposed between the fluid supply source, and a branch point between the upper supply line and the lower supply line;
   a second supply valve installed in the upper supply line; and
   a third supply valve installed in the lower supply line, and
   wherein the first pre-vent line is connected to the lower supply line upstream of the third supply valve.

8. The apparatus of claim 1, wherein the first pre-vent line is connected to the supply line downstream of the line heater.

9. The apparatus of claim 8, wherein the pre-vent unit includes:
   a second pre-vent line having one end connected to the exhaust line and an opposite end connected to the first pre-vent line; and
   a second pre-vent valve installed in the second pre-vent line, and
   wherein the second pre-vent valve is open after the substrate is introduced into the high pressure chamber and the high pressure chamber is closed.

10. An apparatus for treating a substrate, the apparatus comprising:
    a liquid treating chamber configured to supply a treatment liquid to the substrate and perform liquid treatment for the substrate;
    a supercritical chamber configured to treat the substrate by using a process fluid in a supercritical state;
    a transfer robot configured to carry the substrate between the liquid treating chamber and the supercritical chamber; and
    a controller,
    wherein the liquid treating chamber includes:
    a support unit configured to support the substrate;
    a nozzle configured to supply the treatment liquid on the substrate; and
    a cup configured to surround the support unit and provide a treatment space,
    wherein the supercritical chamber includes:
    a high pressure chamber configured to provide the treatment space to perform a process of treating the substrate using a process fluid;
    a fluid supply source configured to provide the process fluid to the high pressure chamber;
    a supply line configured to connect the high pressure chamber to the fluid supply source;
    a supply valve installed in the supply line;
    a line heater provided in the supply line;
    an exhaust unit configured to exhaust the process fluid in the high pressure chamber,
    the exhaust unit including an exhaust line having one end connected to the high pressure chamber and an opposite end which is vented; and
    a pre-vent unit configured to vent a process fluid remaining inside the supply line, and
    wherein the pre-vent unit includes:

a first pre-vent line having one end connected to the supply line and an opposite end which is vented;

a first pre-vent valve installed in the first pre-vent line;

a second pre-vent line having one end connected to the exhaust line and an opposite end vented through being connected to the end of the first pre-vent line which is vented; and a second pre-vent valve installed in the second pre-vent line, wherein the controller is configured to open the supply valve of the supercritical chamber and the first pre-vent valve, before introducing the substrate, which is subject to the liquid treatment in the liquid treating chamber, into the high pressure chamber;

further open the second pre-vent valve after the substrate is introduced into the high pressure chamber and the high pressure chamber is closed, wherein the second pre-vent line has a diameter provided to be less than a diameter of the first pre-vent line.

11. An apparatus for treating a substrate, the apparatus comprising:

a high pressure chamber configured to provide a treatment space to perform a process of treating the substrate by using a process fluid;

a fluid supply source configured to provide the process fluid to the high pressure chamber;

a fluid supply unit configured to supply the process fluid to the treatment space of the high pressure chamber;

an exhaust unit configured to exhaust the process fluid in the high pressure chamber; and a pre-vent unit configured to vent a process fluid remaining inside a supply line, wherein the fluid supply unit includes:

a supply line configured to connect the high pressure chamber to the fluid supply source;

a supply valve installed in the supply line; and a line heater provided in the supply line, wherein the exhaust unit includes:

an exhaust line having one end connected to the high pressure chamber and an opposite end which is vented; and an exhaust valve installed in the exhaust line, and wherein the pre-vent unit includes:

a first pre-vent line having one end connected to the supply line of the fluid supply unit and an opposite end which is vented;

a first pre-vent valve installed in the first pre-vent line;

a second pre-vent line having one end connected to the exhaust line and an opposite end vented through being connected to the end of the first pre-vent line which is vented; and a second pre-vent valve installed in the second pre-vent line, wherein a diameter of a part, which is connected to the second pre-vent line, of the first pre-vent line is provided to be less than a diameter of the first pre-vent line upstream of the part connected to the second pre-vent line.

12. The apparatus of claim 10, wherein a diameter of a part, which is connected to the second pre-vent line, of the first pre-vent line is provided to be less than a diameter of the first pre-vent line upstream of the part connected to the second pre-vent line.

13. The apparatus of claim 12, wherein the controller is configured to:

start pre-venting the supply line of the supercritical chamber by opening the first pre-vent valve while the substrate is treated in the liquid treating chamber.

* * * * *